(12) United States Patent
Sekiguchi et al.

(10) Patent No.: US 7,709,797 B2
(45) Date of Patent: May 4, 2010

(54) DETECTION DEVICE AND IMAGE FORMING DEVICE

(75) Inventors: Ryota Sekiguchi, Kawasaki (JP); Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 567 days.

(21) Appl. No.: 11/714,790

(22) Filed: Mar. 7, 2007

(65) Prior Publication Data

US 2007/0215808 A1    Sep. 20, 2007

(30) Foreign Application Priority Data

Mar. 17, 2006    (JP) .............................. 2006-075052

(51) Int. Cl.
*G01J 5/02* (2006.01)
(52) U.S. Cl. ................................. 250/339.01
(58) Field of Classification Search ............. 250/338.1, 250/339.01, 341.1
See application file for complete search history.

(56) References Cited

U.S. PATENT DOCUMENTS

| | | | |
|---|---|---|---|
| 5,586,131 A | 12/1996 | Ono et al. ....................... 372/19 |
| 5,659,560 A | 8/1997 | Ouchi et al. .................... 372/27 |
| 5,699,373 A | 12/1997 | Uchida et al. .................. 372/27 |
| 5,764,670 A | 6/1998 | Ouchi ............................ 372/42 |
| 5,858,799 A * | 1/1999 | Yee et al. ..................... 436/164 |
| 6,854,901 B1 | 2/2005 | Ouchi ............................ 385/89 |
| 7,062,116 B2 | 6/2006 | Ouchi ............................ 386/14 |
| 7,248,995 B2 | 7/2007 | Itsuji et al. ................... 702/159 |
| 2003/0206708 A1 | 11/2003 | Estes et al. .................. 385/130 |
| 2006/0034729 A1* | 2/2006 | Poponin ...................... 422/82.05 |
| 2006/0039431 A1 | 2/2006 | Sekiguchi et al. ......... 372/44.01 |
| 2006/0085160 A1 | 4/2006 | Ouchi ........................ 702/150 |
| 2006/0188398 A1 | 8/2006 | Yano et al. ................ 422/82.01 |
| 2006/0197021 A1 | 9/2006 | Ouchi ........................ 250/343 |
| 2006/0214176 A1 | 9/2006 | Ouchi et al. ................... 257/98 |
| 2006/0227340 A1 | 10/2006 | Shioda et al. ................ 356/614 |
| 2006/0244629 A1 | 11/2006 | Miyazaki et al. ......... 340/855.7 |
| 2007/0030115 A1 | 2/2007 | Itsuji et al. .................... 340/5.8 |
| 2007/0195921 A1 | 8/2007 | Ouchi ............................ 378/1 |
| 2007/0235718 A1 | 10/2007 | Kasai ....................... 250/338.4 |

FOREIGN PATENT DOCUMENTS

JP    8-145787    6/1996

OTHER PUBLICATIONS

Shaner et al., "Single-quantum-well grating-gated terahertz plasmon detectors" Applied Physics Letters 87, 193507 (2005), pp. 1-3.*

(Continued)

*Primary Examiner*—David P Porta
*Assistant Examiner*—Marcus H Taningco
(74) *Attorney, Agent, or Firm*—Fitzpatrick, Cella, Harper & Scinto

(57) ABSTRACT

There is a need for a detection device which has high photoreceptive sensitivity in a generally wide frequency region including the infrared region. Therefore, in the present invention, by utilizing a phenomenon in which electric field strength is enhanced by surface plasmon resonance in a negative dielectric constant medium, a detection device is provided which has an electromagnetic wave detection portion disposed at a position where the electric field strength is large.

11 Claims, 5 Drawing Sheets

OTHER PUBLICATIONS

Tsutomu Ishi, et al., "Si Nano-Photodiode with a Surface Plasmon Antenna", Japanese Journal of Applied Physics, vol. 44, No. 12, 2005, pp. L364-L366.

Daboo C. et al., "Surface-Plasmon-Enhanced Photodetection in Planar AU-GAAS Schottky Junctions" Thin Solid Films, Elsevier-Sequoia S.A. Lausanne, CH, vol. 189, No. 1, Aug. 1, 1990, pp. 27-38.

* cited by examiner

DETECTION DEVICE AND IMAGE FORMING DEVICE

BACKGROUND OF THE INVENTION

1. Field of the Invention

The present invention relates to a detection device for detecting an electromagnetic wave of a generally wide frequency region including the infrared region and ranging between a longer wavelength region of the millimeter wave region to the terahertz bandwidth (30 GHz to 30 THz) and a shorter wavelength region of the visible light region, and to an image forming device using the detection device.

2. Description of the Related Art

As a detection device in the infrared region, there have hitherto been widely known a thermal detection device having no wavelength dependency and a quantum detection device having wavelength dependency. Most of these devices utilize a feature of infrared detection. For example, these are applied in a wide range of fields and various applications such as a human body detector at an automatic door, a temperature sensor in a fire alarm or air conditioner, a gas detector using an infrared absorption spectrum of gas, and space research in the submillimeter wave/far-infrared region. Here, the thermal detection device includes, for example, a pyroelectric device ($LiTaO_3$, TGS, etc.), a Golay cell and a bolometer. In addition, the quantum detection device includes, for example, an intrinsic semiconductor device (InGaAs PIN photodiode, MCT photoconduction device, etc.) and an impurity semiconductor device. In addition, a schottky barrier diode can perform the both operations.

Comparing the both types of devices with each other, the thermal detection device has a feature of simple, convenient usability, and for example, a typical thermal detection device does not need cooling, while a typical quantum detection device needs cooling. On the other hand, it is known that the thermal detection device generally has small detectivity because of its small photoreceptive sensitivity and large NEP (Noise Equivalent Power). The detectivity can be represented by specific detectivity D*. Generally, it is said that the larger D* (D-Star) is, the better a detection device is, and in addition, in order to easily compare different devices with each other, D* is given as a reciprocal of NEP normalized to square root of unit area. Comparing the both types of devices with each other in terms of the specific detectivity, for example, the specific detectivity D* of a typical quantum detection device in the mid-infrared region is within the range from $10^{10}$ $cm \cdot Hz^{1/2}/w$ to $10^{11}$ $cm \cdot Hz^{1/2}/w$, and the D* of a typical thermal detection device is within the range from $10^8$ $cm \cdot Hz^{1/2}/w$ to $10^9$ $cm \cdot Hz^{1/2}/w$. Therefore, as seen from the D*, it can be said that the thermal detection device is inferior in performance to the quantum detection device by about two orders of magnitude.

As described above, the thermal detection device has convenient usability, but on the one hand, it has small detectivity and a very wide, detectable frequency region. Then, in order to improve detectivity in a particular wavelength region, a method is usually used in which the noise on the whole of a device is reduced by using a wavelength selection filter that allows an electromagnetic wave in a part of a detectable frequency region to pass therethrough. For example, Japanese Patent Application Laid-Open No. H08-145787 discloses a method of narrowing down infrared light to be detected by a pyroelectric device by use of a diffraction optical lens. At this time, the diffraction optical lens functions as a wavelength selection filter for infrared light. Furthermore, since the utilization of the diffraction optical lens reduces lowering of the light intensity of infrared light due to passing through the filter, the device disclosed in the patent document has a structure such that the photoreceptive sensitivity of the device as a whole is difficult to lower.

In addition, on the other hand, the development of the light detection technology has enabled detection of an optical electric field involved with surface plasmon. Tsutomu Ishii et al.; Jpn. Jour. Appl. Phys., Vol. 44 (2005), L364 disclose a structure in which photodiodes are integrated on a metal diffraction ring for selectively enhancing optical electric field of a particular wavelength which has a hole with a diameter not larger than the wavelength provided at the center thereof and has some grooves provided at intervals of a dimension similar to the wavelength. At this time, light desired to be detected is concentrated in the form of surface plasmon at the center of the metal diffraction ring to show an effect to enhance the optical electric field at the central hole where the photodiodes are positioned. Therefore, there is a possibility that utilization of such enhancing effect may improve the photoreceptive sensitivity of the device as a whole.

SUMMARY OF THE INVENTION

However, in the conventional examples of the pyroelectric device using a wavelength selection filter, it is difficult to improve the photoreceptive sensitivity. It is because the intensity of light after passing through an ordinary filter is smaller than that before passing through the filter. Further, in the conventional example in which photodiodes are integrated in the center of the metal diffraction ring, even though the effect of improving the photoreceptive sensitivity is provided, the magnitude of device area of the photodiodes is limited to be equal to or less than the wavelength, so that the detection area is limited.

Therefore, the present invention provides a detection device which solves the above-mentioned problems, has an effect of improving the photoreceptive sensitivity with respect to a generally wide frequency region including the infrared region, and has a larger detection area than that of the detection portion of the device disclosed in Tsutomu Ishii et al.; Jpn. Jour. Appl. Phys., Vol. 44 (2005), L364.

The present invention provides a detection device configured as follows.

That is, the present invention provides a detection device for detecting an electromagnetic wave which includes a filter portion for selecting a wavelength region of an electromagnetic wave to be detected, the filter portion including a first medium having a dielectric constant with a negative real part and a second medium which is different from the first medium; and an electromagnetic wave detection portion, wherein a distance between the first medium and the second medium is not more than a wavelength of the electromagnetic wave to be detected, and a distance between the first medium and the electromagnetic wave detection portion is not more than the wavelength of the electromagnetic wave to be detected.

Further, the present invention also provides a detection device for detecting an electromagnetic wave, which includes a filter portion for selecting a wavelength region of an electromagnetic wave to be detected, the filter portion having a grating shape with a period which is not more than a wavelength of the electromagnetic wave to be detected and including a negative dielectric constant medium having a dielectric constant with a negative real part; and an electromagnetic wave detection portion, wherein the electromagnetic wave detection portion is exposed in a recess of the grating shape.

Further features of the present invention will become apparent from the following description of exemplary embodiments with reference to the attached drawings.

DESCRIPTION OF THE EMBODIMENTS

In the present invention, the electromagnetic wave detection portion may be, for example, a thermal detection device or a quantum detection device. The detection device of the present invention adapted in such a manner utilizes surface plasmon resonance at the first medium (negative dielectric constant medium) as a wavelength selection filter. Then, by utilizing the phenomenon in which the electric field strength of a wavelength selected by the surface plasmon resonance is enhanced, and further by adopting the configuration in which a thermal detection device or a quantum detection device is disposed at a position where the electric field strength is large, a detection device having photoreceptive sensitivity higher than that of a conventional detection device can be provided.

Incidentally, the terms "photo" as well as "light" herein employed in the terms such as "photoreceptive sensitivity" or "light detection" refer widely to electromagnetic wave and not limited to a specific or particular electromagnetic wave region such as the infrared or visible region.

According to the configuration of the present invention, a detection device can be provided which has higher photoreceptive sensitivity in a wavelength region selected of a generally wide frequency region including the infrared region.

(Configuration)

Now, exemplary embodiments for carrying out the present invention will be described with reference to the accompanying drawings. The detection device described herein includes a thermal detection device and also includes a medium and a negative dielectric constant medium.

Figure 1:
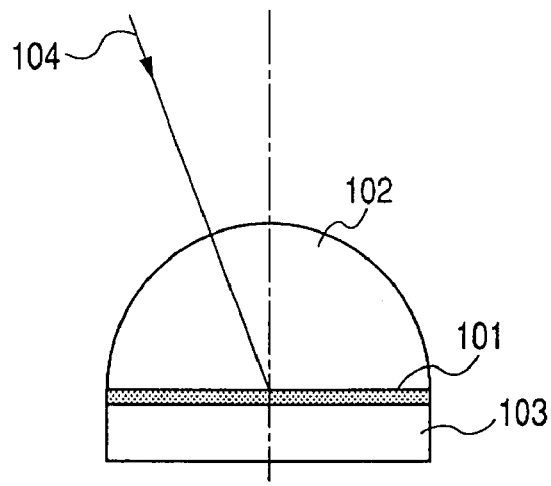
FIG. 1 is a cross-sectional view illustrating an exemplary embodiment for carrying out the present invention.

FIG. 1 is a cross-sectional view illustrating an exemplary embodiment for carrying out the present invention. In FIG. 1, a negative dielectric constant medium, i.e., a first medium 101 has a dielectric constant with a negative real part in an electromagnetic wave region used. In a frequency region of from the millimeter wave band to the terahertz band, for example, a carrier-doped semiconductor (InAs, GaAs, Si, etc.) may preferably be used, and in a frequency region of from the near-infrared region to the visible region, for example, a metal (Ag, Au, Al, etc.) may preferably be used. Further, a transparent conductive film (ITO, etc.) may also be selected to use, and a typical transparent conductive film has a dielectric constant with a negative real part in a range up to the near-infrared region. In FIG. 1, a thermal detection device is denoted by reference numeral 103. Most of thermal detection devices are so-called dielectric having a dielectric constant with a positive real part and a comparatively small dielectric tangent. Therefore, they may preferably be used in the exemplary embodiment for carrying out the present invention. A second medium 102 has, at least in a part thereof, a dielectric constant which is larger than the dielectric constant of the thermal detection device 103 or than the effective dielectric constant of a portion near the thermal detection device, and for the second medium, well-known dielectric may be used. For example, in a frequency region (30 GHz to 30 THz) of from the millimeter wave band to the terahertz band, for example, fine ceramics known as a high-k material may be used. Further, in a frequency region of the near-infrared region to the visible region, Si (undoped) or $TiO_2$ may be used. Particularly, the detection device of the present invention can preferably be used as a device for detecting an electromagnetic wave of a wavelength including a part of a frequency region of 30 GHz to 30 THz. Further, in FIG. 1, the second medium 102 has the semicircular cross-sectional shape, but it may have any shapes. The positional relation between the first medium (negative dielectric constant medium) 101, the second medium 102, and the thermal detection device 103 is similar to that in the Kretschmann configuration in the hitherto well known surface plasmon resonance sensor. That is, from the incidence side of an electromagnetic wave 104 intended to be detected, the second medium 102, the first medium 101, and the thermal detection device 103 are disposed in the mentioned order. As shown in FIG. 1, the second medium 102, the first medium 101, and the thermal detection device 103 are disposed in contact with each other. However, they may be disposed distant from each other by a distance not greater than the wavelength of the electromagnetic wave to be detected. When they are disposed simply in a stack as shown in FIG. 1, in order that surface plasmon is held on the rear side (thermal detection device 103 side) of the first medium (negative dielectric constant medium) 101, it is necessary to satisfy the following relation.

$$\mathrm{Re}\,(\epsilon_1) < -\epsilon_3$$

Further, in order to excite the surface plasmon, it is also necessary to satisfy the following relation.

$$\epsilon_2 > \epsilon_3$$

In the above equations, $\mathrm{Re}\,(\epsilon_1)$ is the real part of the dielectric constant of the layer of the negative dielectric constant medium 101, $\epsilon_2$ is the dielectric constant of the second medium 102, and $\epsilon_3$ is the dielectric constant of the thermal detection device 103.

Incidentally, in FIG. 1, the first medium (negative dielectric constant medium) 101 has a film shape, but it is only necessary that at least a part of the first medium (negative dielectric constant medium) 101 has a film shape. Further, the method of extracting a light detection electric signal obtained by the thermal detection device according to the light detection is not illustrated because it may vary depending on a specific example of the thermal detection device 103. The method will be described with reference to the following examples.

(Principle)

The reason why the present invention can improve the photoreceptive sensitivity with the configuration described above is as follows. That is, when an electromagnetic wave 104 of a given wavelength is incident on the first medium (negative dielectric constant medium) 101 through the second medium 102, and when conditions necessary to generate surface plasmon resonance are met, surface plasmon can be excited and held by the first medium (negative dielectric constant medium) 101. The conditions necessary to generate the surface plasmon resonance are determined based on the wavelength or incidence angle of the electromagnetic wave, and the constitution such as the dielectric constant or shape of the negative dielectric constant medium. When the incident electromagnetic wave contains a p-polarized light component, in a configuration designed for causing resonance, surface plasmon is excited on the electromagnetic wave detection portion 103 facing side of the negative dielectric constant medium 101. Here, in the case of an electromagnetic wave having a polarization plane such as a laser beam, it is desirable to make such adjustment as to increase the p-polarized light component. In the case of no polarization, a plurality of polarization planes or elliptical/circular polarized light, adjustment may not be made. The surface plasmon is accompanied by an electromagnetic field having an electric field vector perpendicular to the surface of the first medium (negative dielectric constant medium) 101, and the electric field strength thereof is typically several tens to several hundreds times greater than the electric field strength of the incident electromagnetic wave. This is called an electric field enhancing effect and is widely known. Here, in the state in which the thermal detection device 103 is disposed as shown in FIG. 1, the electromagnetic field accompanying the surface plasmon held by the first medium (negative dielectric constant medium) 101 starts to leak into the thermal detection device 103. The electric field strength at this time is detected by the thermal detection device 103, so that a large light detection signal can be obtained, whereby the photoreceptive sensitivity of the device as a whole is improved. In other words, when an electromagnetic wave with a given wavelength and a given strength is incident on the first medium (negative dielectric constant medium) 101 through the second medium 102 and surface plasmon resonance is caused, the electric field strength in the thermal detection device 103 becomes greater by several ten times to several hundred times. For the sake of simplicity, assuming that the photoreceptive sensitivity of the thermal detection device 103 is constant (independently of the electric field strength), and the electric field enhancing effect has a magnification of, for example, 100 times, then the light detection electric signal obtained by the thermal detection device 103 at this time is calculated as the photoreceptive sensitivity×100. This means that the photoreceptive sensitivity of the device as a whole is improved by 100 times. Therefore, the first medium (negative dielectric constant medium) 101 and the second medium 102 work as a filter to select a wavelength. Further, at this time, it may also be said that they work as if they amplify the electric field strength of the electromagnetic wave passing through the filter by several ten times to several hundred times. However, the electromagnetic field of the electromagnetic wave which has passed through the filter is not an electromagnetic wave which propagates. In this way, when the effect of enhancing the photoreceptive sensitivity of the device as a whole is provided, because NEP is inversely proportional to the photoreceptive sensitivity, the NEP of the device as a whole is excellent, so that D* is excellent as well.

Figure 2:
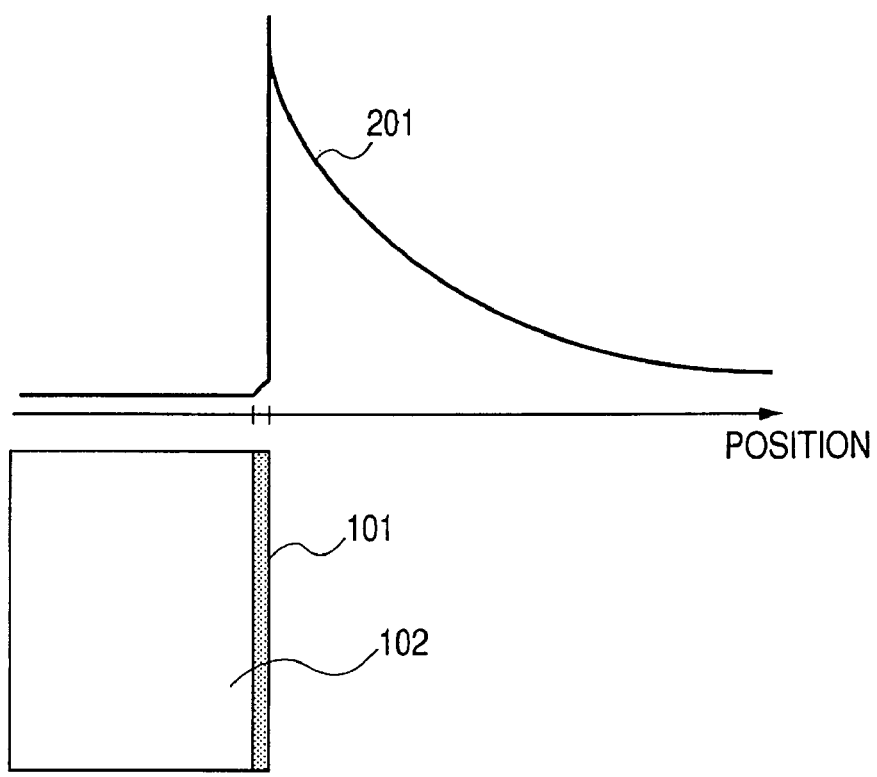
FIG. 2 is a schematic diagram illustrating the effect of enhancing an electric field provided by an exemplary embodiment for carrying out the present invention.

FIG. 2 is a schematic diagram illustrating a typical example of the electric field enhancing effect described above. The graph illustrates a positional relation between electric field strength 201 and a location in the device structure and is represented with the electric field strength of incident electromagnetic wave being normalized as 1. As is seen from FIG. 2, the electric field strength becomes large at a position on the rear side (the thermal detection device 103 side) of the first medium (negative dielectric constant medium) 101. The magnitude thereof decreases exponentially, but remains sufficiently large up to a position which is distant from the rear side surface by a distance similar to the wavelength of the incident electromagnetic wave. Therefore, it is considered appropriate that the thermal detection device 103 is disposed in the vicinity of the first medium (negative dielectric constant medium) 101. The magnitude of electric field strength is dependent on the real part of dielectric constant and the shape of the first medium (negative dielectric constant medium) 101 and the other configurations. The inventors have computed the magnitude of electric field strength, assuming, for example, that He—Ne laser (wavelength: 633 nm) is a light source, and that an Ag thin film (thickness: 50 nm) is used as the first medium (negative dielectric constant medium) 101 and BK7 glass is used as the second medium 102. As a result, the magnification of electric field strength is computed to be about 350 as a peak value.

Further, because the electric field enhancing effect described above occurs everywhere on the rear side (the thermal detection device 103 side) of the first medium (negative dielectric constant medium) 101, even when the area of the whole of the configuration is enlarged, the effect will not be reduced. Therefore, according to the present invention, since the photoreceptive area can be made comparatively large, detection of weaker light can be performed with a larger light detection electric signal output.

(Other Configurations)

In addition to the exemplary embodiment for carrying out the present invention described above, the following configuration having the electric field enhancing effect may be adopted. That is, the positional relation between the first medium (negative dielectric constant medium), the second medium, and the thermal detection device may be similar to the positional relation of the Otto configuration in the surface plasmon resonance sensor well known in the visible region. At this time, from the incidence side of an electromagnetic wave intended to be detected, the second medium, the first medium (negative dielectric constant medium), and the thermal detection device are disposed in the mentioned order. Alternatively, the medium is not used, and gating process may be applied to the first medium (negative dielectric constant medium) at a pitch equal to or less than the wavelength of an electromagnetic wave intended to be detected (generally less than the wavelength, though depending on the negative dielectric constant medium), and further the thermal detection device may be disposed. Because these configurations all have the electric field enhancing effect resulting from surface plasmon resonance, the photoreceptive sensitivity and detectivity of the device as a whole can be improved and further the photoreceptive area can be made comparatively large.

Further, provided that the frequency region is limited, the thermal detection device described above may be replaced by a quantum detection device. This is because most of the quantum detection device is a semiconductor device, and a typical, carrier-doped semiconductor behaves as a metal at least in a wavelength region (including from the millimeter band to the terahertz band) which is longer than the mid-infrared region. This is because it is qualitatively explained as a metal in a frequency region lower than a plasma frequency and as a dielectric in a frequency region higher than the plasma frequency. In the present invention, the above-mentioned effect is provided in a frequency region described as a dielectric, so that the thermal detection device described above can be replaced by the quantum detection device only in a frequency region of the mid-infrared to visible region.

(Additional Configuration)

Further, in the exemplary embodiments for carrying out the present invention described above, because it is considered in many cases that an electromagnetic wave desired to be detected propagates through air to enter a detection device, a configuration for reducing Fresnel reflection loss between air and a medium can also be adopted. To implement this, the medium may be provided with a structure for impedance conversion between a free space and the medium, such as a configuration in which SWG (Sub-Wavelength Grating) is applied to the medium or a configuration including AR coating.

EXAMPLE 1

Figure 3:
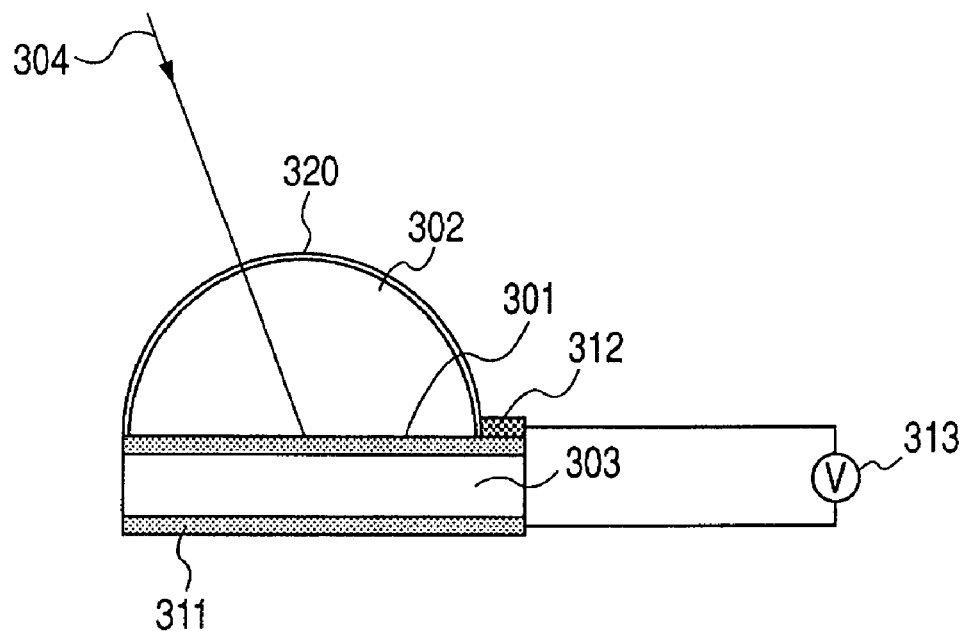
FIG. 3 is a cross-sectional view illustrating the configuration of a detection device of Example 1.

FIG. 3 is a cross-sectional view illustrating an example of a configuration of a detection device and a filter according to the present invention. In FIG. 3, n-InAs 301 has a dielectric constant with a negative real part in a frequency region including the millimeter wave band up to the terahertz band. Titania ceramics 302 is well known as high-k material in the same frequency region. A DLaTGS crystal 303 is known as a pyroelectric device in the same frequency region. In addition, electrodes 311, 312 work to extract spontaneous polarization of the DLaTGS crystal involved with detection in form of voltage. Therefore, a voltage detector 313 is provided. Further, the voltage detector 313 may include an impedance matching circuit (e.g., a source follower circuit).

The configuration is the Kretschmann configuration such as shown in FIG. 3, and as described above, from the incidence side of an electromagnetic wave 304 desired to be detected in the range of the millimeter wave band to the terahertz band, the titania ceramics 302, the n-InAs 301 and the DLaTGS crystal 303 are disposed in the mentioned order. These may either be disposed in contact with each other or disposed distant from each other by a distance not greater than the wavelength of an electromagnetic wave used, and in this example, they are in contact with each other as shown in FIG. 3. The thickness of the n-InAs 301 has an optimal value, and when set to the optimal value, the highest electric field enhancing effect is obtained. At this time, the photoreceptive sensitivity of the device as a whole is high, so that a large response can be obtained by the voltage detector 313. Now, assuming that the wavelength of light desired to be detected is within the range of 0.5 THz to 1.0 THz in terms of frequency. Computation is performed based on the Fresnel reflection equation, assuming that the DLaTGS crystal 303 has a dielectric constant (relative dielectric constant) of 19, the titania ceramics 302 has a dielectric constant of 110, and the Drude model for complex dielectric constant is used for the n-InAs 301. In the Drude model for complex dielectric constant, it is set that the number of free electrons is $1.0 \times 10^{16}$ cm$^{-3}$, the effective mass $m_{eff}$=0.03, the reciprocal of relaxation time $\gamma/2\pi$=0.30 THz, and the background dielectric constant $\in_b$=14.5. According to these, the optimal thickness of the n-InAs 301 is about 5 μm. At this time, considering that the D* of the DLaTGS crystal 303 is originally about $10^9$ cm·Hz$^{1/2}$/w and the electric field enhancing effect has the magnification of several ten times, it may be expected that the detectivity of the device as a whole is about $10^{10}$ cm·Hz$^{1/2}$/w at the maximum. Further, since during the resonance, the n-InAs 301 and the titania ceramics 302 also exhibit the effect of a wavelength selection filter (the pass band may be considered to be about γ), the detectivity of the device as a whole is more excellent.

Incidentally, the photoreceptive sensitivity of the DLaTGS crystal 303 is dependent on the environmental temperature and is unstable, an external temperature controller may be added to the configuration. Further, in a frequency region of the millimeter wave band to the terahertz band, such as in the present example, SWG 320 has a comparatively large wavelength and is easy to work.

The method of making the above described configuration is as follows. That is, an n-InAs substrate and a DLaTGS crystal are directly solid-phase bonded to each other and worked by grinding or the like to leave an n-InAs thin film with a thickness of 5 μm, thereby providing a desired form. The method of solid phase bonding includes a method of raising temperature under pressure, a method of applying an electric field and the like. Alternatively, the surfaces of the two members may be brought into contact with each other and an adhesive may be coated on the periphery thereof and then cured. After forming the n-InAs thin film by grinding, an electrode 312 is formed on a part of its surface as shown in FIG. 3. Subsequently, a medium 302 is placed thereon, and then, for example, an adhesive is coated to the periphery and cured. When the medium 302 is sintered to be formed, SWG 320 may be carved in form of the original shape. Alternatively, after forming as shown in FIG. 1, it may be formed by machine work such as cutting or laser machining.

Incidentally, THE semiconductor is not limited to InAs, and there may also be used a group IV element or compound thereof such as Si, SiGe, InGaAs, GaAs, GaN, GaSb and CdTe, a group III-V compound semiconductor, a group II-VI compound semiconductor and the like. Although in the present example, thin-film formation is performed by grinding of the substrate, the epitaxial lift-off (ELO) technology may be used in which a buffer layer and an active layer are grown epitaxially on a substrate by, for example, a MBE method and then only the active layer is transferred onto a crystal constituting a pyroelectric device. Alternatively, there may be used a thin film obtained by forming an amorphous film of the above-mentioned semiconductor at a low temperature directly on a crystal constituting a pyroelectric device, or by further crystallizing the resultant by a process such as laser annealing.

Figure 9:
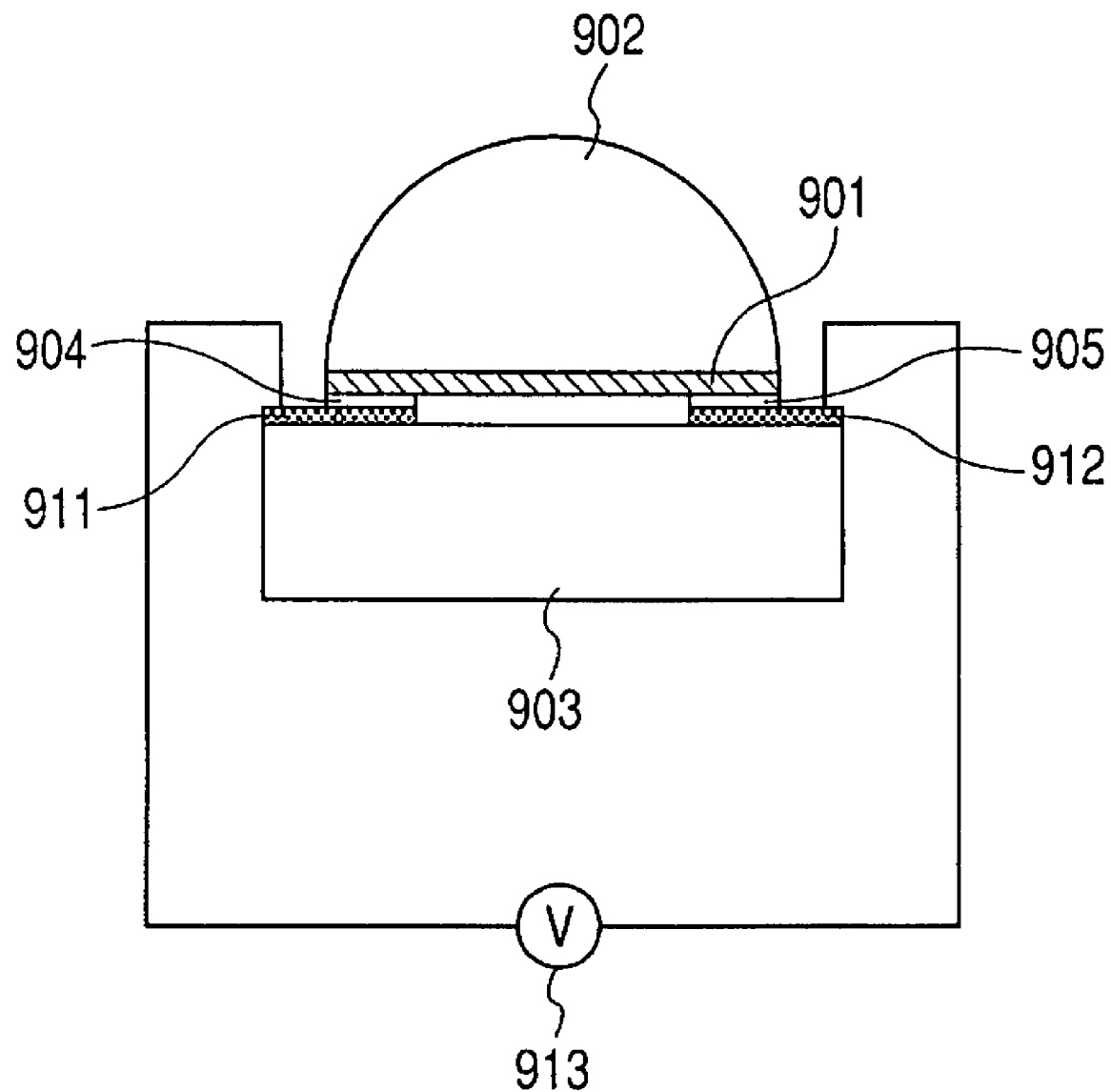
FIG. 9 is a cross-sectional view illustrating the configuration of the detection device of Example 1.

The configuration as shown in FIG. 9 may be made by using metal welding to bond a DLaTGS crystal and a semiconductor. That is, first, a metal film such as of Ti/Au is vapor deposited on an n-InAs substrate so that a window region of 1 mm in diameter as a light receiving region where the metal film is not present is formed by a lift-off method or the like to leave metal films 904, 905 at the periphery. Ti/Au metal films 911, 912 similarly having a window region are formed on a DLaTGS crystal, and the DLaTGS crystal and the n-InAs substrate are bonded under pressure while aligning the window regions to each other. Subsequently, grinding or the like is performed to leave an n-InAs film 901 in a thickness of 5 μm, thereby providing a desired form. In this case, a configuration may be adopted in which the metal films 911 and 912 are used as electrodes to extract polarization produced on the surface of the DLaTGS crystal in the lateral direction in the form of a voltage 913. In the figure, titania ceramics (medium) is denoted by 902.

Figure 7:
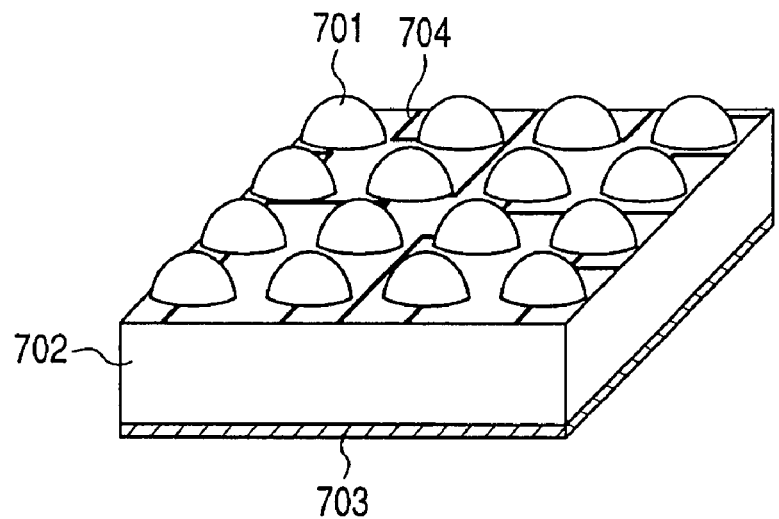
FIG. 7 is a schematic perspective view illustrating a two-dimensional array arrangement of the detection device of Example 1.

Although the above description has been made by taking a single device as an example, an image can be picked up by arranging a plurality of devices to form a two-dimensional array. For example, FIG. 7 illustrates a 4-by-4 array. On the pyroelectric body crystal substrate 702, the semiconductor films described above (not shown) and the media 701 are disposed independently of each other. Electrodes 704 each corresponding to a pixel are drawn out independently of each other to allow signals of the respective pixels to be detected separately. On the other hand, a common electrode 703 is formed on the rear side. According to this configuration, for example, an image can be picked up at a high speed in the terahertz band. Although in this example, sixteen pixels are integrated, the number of pixels can be increased to provide a configuration by which a two-dimensional image can be picked up in high resolution.

EXAMPLE 2

Figure 4:
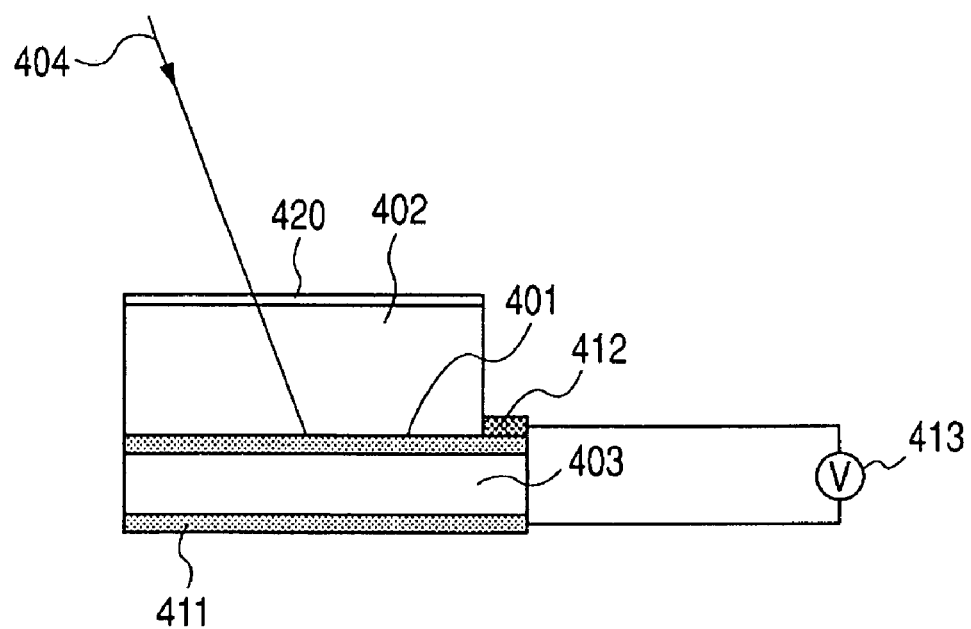
FIG. 4 is a cross-sectional view illustrating the configuration of a detection device of Example 2.

FIG. 4 is a cross-sectional view illustrating an example of a configuration of a detection device and a filter according to the present invention. In FIG. 4, ITO ($In_2O_3$—$SnO_2$) 401 has a dielectric constant with a negative real part in a frequency region including the mid-infrared region to the near-infrared region. Si (undoped) 402 is comparatively transparent, high refractive index material in a frequency region of a wavelength not smaller than 1 μm. A $LiTaO_3$ crystal 403 is known as a pyroelectric device in the same frequency region. In addition, electrodes 411, 412 work to extract spontaneous polarization of the $LiTaO_3$ crystal involved with detection in form of voltage. Therefore, a voltage detector 413 is provided. Further, the voltage detector 413 may include an impedance matching circuit (e.g., a source follower circuit).

The configuration is the Kretschmann configuration such as shown in FIG. 4, and as described above, from the incidence side of an electromagnetic wave 404 desired to be detected in the range of the mid-infrared region to the near-infrared region, the Si 402, the ITO 401 and the $LiTaO_3$ crystal 403 are disposed in the mentioned order. These may either be disposed in contact with each other or disposed distant from each other by a distance not greater than the wavelength of an electromagnetic wave used, and in this example, they are in contact with each other as shown in FIG. 4. The thickness of the ITO 401 has an optimal value, and when set to the optimal value, the highest electric field enhancing effect is obtained. At this time, the photoreceptive sensitivity of the device as a whole is high, so that a large response can be obtained by the voltage detector 413. Now, assuming that the wavelength of light desired to be detected is about 3 μm. Computation is performed based on the Fresnel reflection equation, assuming that the $LiTaO_3$ crystal 403 has a dielectric constant (relative dielectric constant) of 4.5, the Si 402 has a dielectric constant of 12, and the Drude model for complex dielectric constant is used for the ITO 401. In the Drude model for complex dielectric constant, it is set that the number of free electrons is $1.0 \times 10^{21}$ cm$^{-3}$, the effective mass $m_{eff}=0.3$, the reciprocal of relaxation time $\gamma/2\pi=5.8$ THz, and the background dielectric constant $\epsilon_b=3.1$. According to these, the optimal thickness of the ITO is about 5 μm. At this time, considering that the D* of the $LiTaO_3$ crystal 403 is originally about $10^8$ cm·Hz$^{1/2}$/w and the electric field enhancing effect has the magnification of about one hundred times, it may be expected that the detectivity of the device as a whole is about $10^{10}$ cm·Hz$^{1/2}$/w at the maximum. Further, since during the resonance, the ITO 401 and the Si 402 also exhibit the effect of a wavelength selection filter (the pass band may be considered to be about γ), the detectivity of the device as a whole is more excellent.

Incidentally, in the present example, an AR coating 420 is applied, but when a configuration with a small Fresnel reflection loss can be attained, an AR coating may not be added.

The method of making the above configuration may be, for example, such that ITO is formed in a film on a cleaved $LiTaO_3$ crystal by sputtering or vapor deposition. Further, for AR coating, a silicon oxide film or silicon nitride film is formed by a method such as CVD.

EXAMPLE 3

Figure 5:
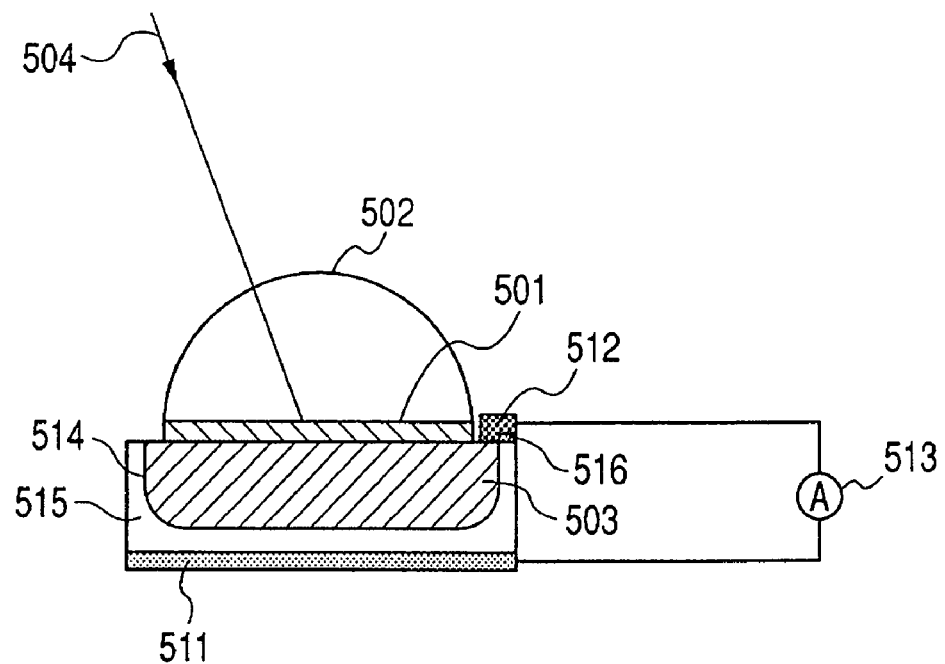
FIG. 5 is a cross-sectional view illustrating the configuration of a detection device of Example 3.

FIG. 5 is a cross-sectional view illustrating an example of a configuration of a detection device and a filter according to the present invention. In FIG. 5, Au 501 has a dielectric constant with a negative real part in a frequency region including the near-infrared region to the visible region. Si (undoped) 502 is comparatively transparent, high refractive index material in a frequency region of a wavelength not smaller than 1 μm. An InGaAs PIN photodiode 503 is known as a PIN photodiode which supports the same frequency region by varying the mixing ratio of mixed crystal such as In or Ga. For example, $In_{53}Ga_{47}As$ which is lattice-matched to an InP substrate has a peak value of D* in a band of 1.5 μm, which is $10^{10}$ cm·Hz$^{1/2}$/w. A p-type region and an n-type region of the InGaAs PIN photodiode are denoted by 514 and 515, respectively. An i-type region exists between the p-type region 514 and the n-type region 515 but is not shown. An insulating film is denoted by 516. Electrodes 511, 512 work to extract a photocurrent involved with the detection. Therefore, a current detector 513 is provided. In addition, the current detector 513 may include a circuit for applying an inverse bias and an amplifying circuit with an operational amplifier.

The configuration is the Kretschmann configuration such as shown in FIG. 5, and as described above, from the incidence side of an electromagnetic wave 504 desired to be detected in the range of the near-infrared region to the visible region, the Si 502, the Au 501, and the InGaAs PIN photodiode 503 are disposed in the mentioned order. These may either be disposed in contact with each other or disposed distant from each other by a distance not greater than the wavelength of an electromagnetic wave used, and in this example, they are in contact with each other as shown in FIG. 5. The thickness of the Au 501 has an optimal value similarly as Example 1, and when set to the optimal value, the highest electric field enhancing effect is obtained. Now, assuming that the wavelength of light desired to be detected is about 1.5 μm. Computation is performed based on the Fresnel reflection equation, assuming that the InGaAs 503 has a dielectric constant (relative dielectric constant) of 11, the Si 502 has a dielectric constant of 12, and the Drude model for complex dielectric constant is used for the Au 501. In the Drude model for complex dielectric constant, it is set that the plasma frequency is 2.2 PHz, the effective mass $m_{eff}=1.0$, the reciprocal of relaxation time $\gamma/2\pi=40$ THz, and the background dielectric constant $\epsilon_b=1.0$. According to these, the optimal thickness of the Au 501 is about 60 nm. At this time, considering that the D* of the InGaAs PIN photodiode 503 is originally about $10^{10}$ cm·Hz$^{1/2}$/w and the electric field enhancing effect has the magnification of about one hundred times, it may be expected that the detectivity of the device as a whole is about $10^{12}$ cm·Hz$^{1/2}$/w at the maximum.

The PIN photodiode generally has an electrode 512 at the periphery or the center of a light receiving region. Further, an insulating film 516 such as a silicon oxide film or silicon nitride film is formed on its surface, and further a gold thin film 501 is formed by a method such as an EB vapor deposition method and a medium 502 is disposed thereon, thereby providing the detection device of the present example.

EXAMPLE 4

Figure 6:
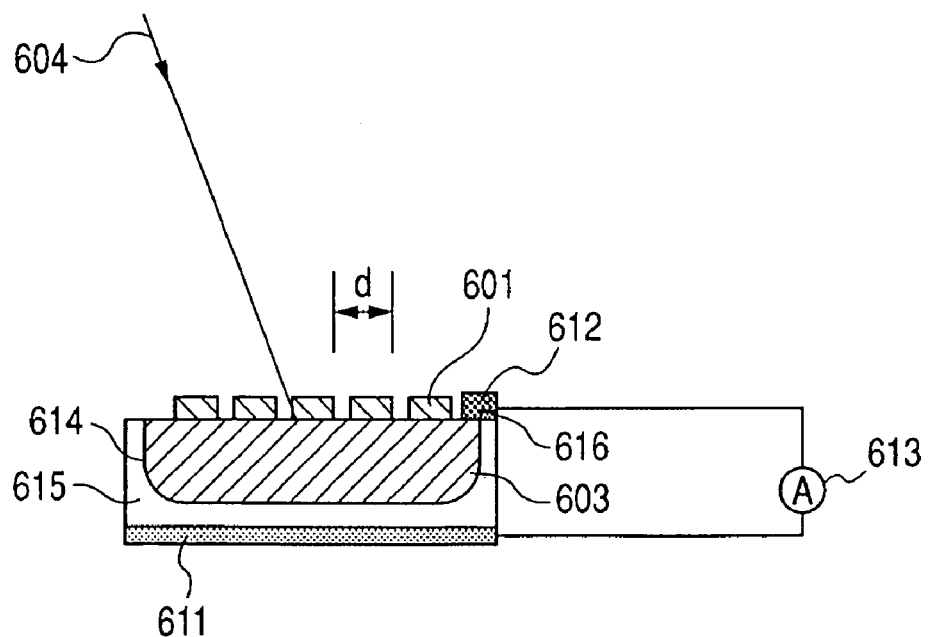
FIG. 6 is a cross-sectional view illustrating the configuration of a detection device of Example 4.

FIG. 6 is a cross-sectional view illustrating an example of a configuration of a detection device and a filter according to the present invention. In FIG. 6, as described above, Au 601 is grating-processed and has in itself a dielectric constant with a negative real part in a frequency region including the near-infrared region to the visible region. The present example is a modification of Example 3, and has the following configuration similar to that that of Example 3. That is, an InGaAs PIN photodiode is denoted by 603, and a p-type region and an n-type region of the InGaAs PIN photodiode are denoted by 614 and 615, respectively. An i-type region exists between the p-type region 614 and the n-type region 615 but is not shown. An insulating film is denoted by 616. Electrodes 611, 612 work to extract a photocurrent involved with the detection. Therefore, a current detector 613 is provided. In addition, the current detector 613 may include a circuit for applying an inverse bias and an amplifying circuit with an operational amplifier. Incident light is denoted by 604.

As shown in FIG. 6, the configuration of the present example is such that the Au 601 is processed to form grating with a period which is equal to or less than the wavelength of an electromagnetic wave desired to be detected (generally less than the wavelength, though depending on a negative dielectric constant medium), and further the InGaAs PIN photodiode 603 is disposed. The photodiode is exposed on the bottom surface of the recessed portion of the grating. According to this, the electromagnetic wave having an electric field strength amplified by the grating can be efficiently detected. The pitch d of the Au grating 601 has an optimal value, and when set to the optimal value, the highest electric field enhancing effect can be obtained. Now, it is assumed that the wavelength of an electromagnetic wave desired to be detected is about 1.5 μm. Computation is performed based on the coupled wave theory, assuming that the InGaAs 603 has a dielectric constant (relative dielectric constant) of 11.6 and the complex refraction index of the Au 601 is represented by the Drude model for complex dielectric constant.

In the Drude model for complex dielectric constant, it is set that the plasma frequency is 2.2 PHz, the effective mass $m_{eff}$=1.0, the reciprocal of relaxation time $\gamma/2\pi$=40 THz, and the background dielectric constant $\in_b$=1.0. According to these, the pitch d of the Au grating 601 has a first order optimal value of about 500 nm. However, it is considered that because there are other wavelengths at which resonance occurs, the effect of wavelength selection filter of the Au grating 601 is somewhat small. In this configuration, since a medium is not necessarily required, the configuration can be made relatively simple.

In the present example, the Au grating 601 is formed on the p-type region 614 by vapor deposition (so as not to cause short circuiting between the p-type and the n-type regions).

EXAMPLE 5

Figure 8:
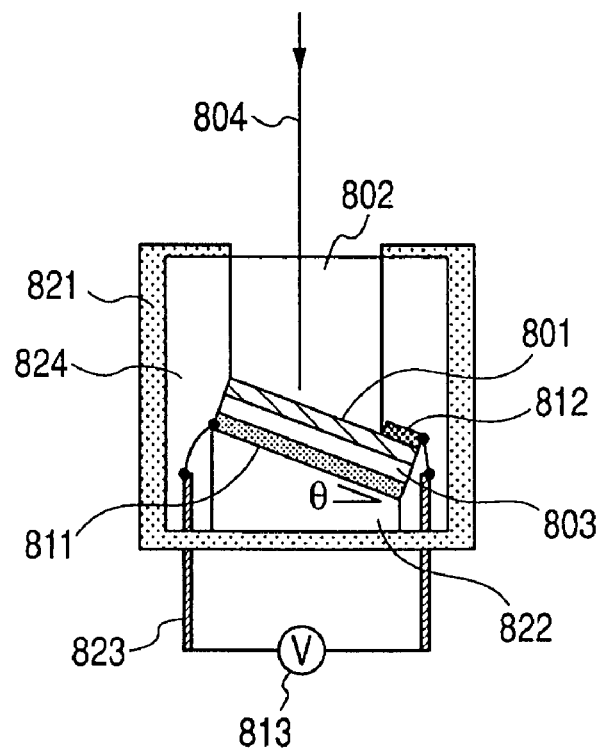
FIG. 8 is a cross-sectional view illustrating the configuration of a detection device of Example 5.

FIG. 8 is a cross-sectional view illustrating an example of a configuration of a detection device and a filter according to the present invention. In FIG. 8, a shielding member 821 is provided in order to narrow the directivity and a holding member 822 is provided to adjust the directivity of the device as a whole. Inert gas 824 such as nitrogen gas (or Ne, Ar, Kr, Xe) exists to prevent damage of the device as a whole. Alternatively, it may be a vacuum sate. The present example is a modification of Example 1 and the configuration thereof is similar to that of Example 1 as follows. That is, n-InAs is denoted by 801, titania ceramics by 802 and DLaTGS crystal by 803. Further, electrodes are denoted by 811, 812, respectively. A voltage detector 813 is connected to the electrodes 811, 812 through a terminal 823. Incident light is denoted by 804.

The shield member 821 may be formed of, for example, suitable metal such as copper or stainless steel. Needless to say, in order to provide a sufficient shielding effect, the thickness thereof is designed to be not smaller than the skin depth of an electromagnetic wave used. In any frequency region of a frequency not less than the millimeter band, it is sufficient that the shield member 821 has a thickness of, for example, 1 μm. In this case, in order to prevent short circuiting of the terminal 823, it is preferable that the terminal 823 is coated. The holding member 822 plays a role of keeping an incidence angle specified in resonance perpendicular as the whole of the device. Similarly to Example 1, it is assumed that the wavelength of an electromagnetic wave desired to be detected is within the range of 0.5 THz to 1.0 THz in terms of frequency. Computation is performed based on the Fresnel reflection equation, assuming that the DLaTGS crystal 803 has a dielectric constant (relative dielectric constant) of 19, the titania ceramics 802 has a dielectric constant of 110, and the Drude model for complex dielectric constant is used for the n-InAs 801. In the Drude model for complex dielectric constant, it is set that the number of free electrons is $1.0 \times 10^{16}$ cm$^{-3}$, the effective mass $m_{eff}$=0.03, the reciprocal of relaxation time $\gamma/2\pi$=0.30 THz, and the background dielectric constant $\in_b$=14.5. According to these, the incidence angle is specified to be about 30 deg. Therefore, as shown in FIG. 8, the holding member 822 is disposed such that an adjustment angle Θ is 30 deg. Here, the holding member 822 may be made of a suitable insulating material, for example, resin or urethane foam which is easily moldable. Further, as the method of producing the whole device including the terminal 823 and the inert gas 824, the well known package mounting technology can be selected and used.

Also, the center wavelength of the electromagnetic wave desired to be detected may be shifted, for example, by placing the thus produced package on a rotatable table and controlling the rotation to change the incidence angle. By acquiring the strength distribution for the change in incidence angle, the configuration can be allowed to function as a system to measure a wavelength spectrum. For example, the configuration can be allowed to function as a spectroscope by irradiating an analyte with an electromagnetic wave from an arbitrary electromagnetic wave generating source and acquiring a wavelength spectrum from the transmitted light or reflected light using the detection device. Further, the spectral characteristics of the electromagnetic wave source itself can be estimated without providing an analyte.

In addition, by using the device of the two-dimensional array shown in FIG. 7 for a device to be packaged, an image chip with high sensitivity for a wavelength selected in the range of the millimeter wave region to the visible region can be provided. Further, an image forming device can be provided by including an image forming portion for forming an image of electric field strength distribution based on differences in electric field strengths detected by the detection device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-075052, filed Mar. 17, 2006, which is incorporated by reference herein in its entirety.

What is claimed is:

1. A detection device for detecting an electromagnetic wave, comprising:

a dielectric portion on which an electromagnetic wave is incident, wherein the electromagnetic wave includes at least a part of a frequency region from 30 GHz to 30 THz;

a film located under the dielectric portion in a direction of the incident electromagnetic wave, wherein the film has a dielectric constant with a negative real part with respect to an electromagnetic wave having a frequency in the frequency region; and an electromagnetic wave detection portion located under the film in the direction of the incident electromagnetic wave, wherein the electromagnetic wave detection portion is constructed to detect an electromagnetic wave having a frequency in the frequency region, wherein an absolute value of the real part of the dielectric constant of the film is larger than a dielectric constant of the electromagnetic wave detection portion, a dielectric constant of the dielectric portion is larger than the dielectric constant of the electromagnetic wave detection portion, and a distance between the film and the electromagnetic wave detection portion is not more than a wavelength of an electromagnetic wave having a frequency in the frequency region.

2. The detection device according to claim 1, wherein the dielectric portion includes an impedance conversion structure.

3. The detection device according to claim 2, wherein the impedance conversion structure is a structure in which a sub-wavelength grating (SWG) is applied to the dielectric portion.

4. The detection device according to claim 2, wherein the impedance conversion structure is a structure in which an anti-reflective (AR) coating is applied to the dielectric portion.

5. The detection device according to claim 1, wherein the film is selected from the group consisting of metal, a semiconductor and a transparent conductive film.

6. The detection device according to claim 1, wherein the electromagnetic wave detection portion is a thermal detection device.

7. An image forming device, comprising:
a plurality of the detection devices set forth in claim 1 disposed in an array; and
an image forming portion for forming an image of an electric field strength distribution based on a difference between electric field strengths detected by the plurality of the detection devices.

8. The detection device according to claim 1, which is configured such that an impedance of space and an impedance of the dielectric are matchable.

9. A detection device for detecting an electromagnetic wave, comprising:
a filter portion for selecting a wavelength region of an electromagnetic wave to be detected, wherein the electromagnetic wave to be detected includes at least a part of a frequency region from 30 GHz to 30THz, and wherein the filter portion has a grating shape with a period which is not more than a wavelength of the electromagnetic wave to be detected and comprises a negative dielectric constant medium having a dielectric constant with a negative real part; and
an electromagnetic wave detection portion, wherein the electromagnetic wave detection portion is exposed in a recess of the grating shape.

10. A detection device for detecting an electromagnetic wave, comprising:
a dielectric portion on which an electromagnetic wave is incident, wherein the electromagnetic wave includes at least a part of a frequency region from 30 GHz to 30 THz;
a film located under the dielectric portion in a direction of the incident electromagnetic wave; and
an electromagnetic wave detection portion located under the film in the direction of the incident electromagnetic wave, wherein the electromagnetic wave detection portion is constructed to detect an electromagnetic wave having a frequency in the frequency region,
wherein a real part of a dielectric constant of the film is negative with respect to an electromagnetic wave having a frequency in the frequency region, an absolute value of the real part of the dielectric constant of the film is larger than a dielectric constant of the electromagnetic wave detection portion, and a dielectric constant of the dielectric portion is larger than the dielectric constant of the electromagnetic wave detection portion, whereby a surface plasmon resonance is caused between the film and the electromagnetic wave detection portion, and
wherein a distance between the film and the electromagnetic wave detection portion is not more than a wavelength of an electromagnetic wave having a frequency in the frequency region.

11. A detection device for detecting an electromagnetic wave, comprising:
a film on which an electromagnetic wave is incident, wherein the electromagnetic wave includes at least a part of a frequency region from 30 GHz to 30 THz, wherein the film has a grating shape with a period which is not more than a wavelength of an electromagnetic wave having a frequency in the frequency region, and wherein the film has a dielectric constant with a negative real part with respect to an electromagnetic wave having a frequency in the frequency region; and
an electromagnetic wave detection portion located under the film in a direction of the incident electromagnetic wave, wherein the electromagnetic wave detection portion is constructed to detect an electromagnetic wave having a frequency in the frequency region,
wherein an absolute value of the real part of the dielectric constant of the film is larger than a dielectric constant of the electromagnetic wave detection portion, and the electromagnetic wave detection portion is exposed in a recess of the grating shape.

* * * * *